(12) United States Patent
Lai

(10) Patent No.: US 9,985,472 B2
(45) Date of Patent: May 29, 2018

(54) SENSING DEVICE AND WEARABLE DEVICE WITH SAME

(71) Applicant: Chiun Mai Communication Systems, Inc., New Taipei (TW)

(72) Inventor: Chin-Kun Lai, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 312 days.

(21) Appl. No.: 14/955,003

(22) Filed: Nov. 30, 2015

(65) Prior Publication Data

US 2017/0126053 A1    May 4, 2017

(30) Foreign Application Priority Data

Oct. 28, 2015  (CN) .......................... 2015 1 0708296

(51) Int. Cl.
| | |
|---|---|
| *G01R 33/00* | (2006.01) |
| *G01R 33/07* | (2006.01) |
| *H02J 7/00* | (2006.01) |
| *H02J 9/06* | (2006.01) |

(52) U.S. Cl.
CPC .......... *H02J 9/061* (2013.01); *G01R 33/0047* (2013.01); *G01R 33/07* (2013.01); *H02J 7/0045* (2013.01); *H02J 7/0063* (2013.01); *H02J 2007/0067* (2013.01)

(58) Field of Classification Search
CPC ... G01R 33/0047; G01R 33/07; H02J 7/0045; H02J 7/0063; H02J 9/061; H02J 2007/0067
See application file for complete search history.

(56) References Cited

U.S. PATENT DOCUMENTS

| | | | | |
|---|---|---|---|---|
| 2010/0072975 | A1* | 3/2010 | Hori ..................... | H01M 10/441 324/66 |
| 2015/0241911 | A1* | 8/2015 | Lim ........................ | G06F 1/163 361/679.03 |

(Continued)

FOREIGN PATENT DOCUMENTS

| | | |
|---|---|---|
| TW | 201248377 A1 | 12/2012 |
| TW | M477603 U | 5/2014 |

OTHER PUBLICATIONS

Universal Serial Bus Specification Revision 2.0, Apr. 27, 2000.

*Primary Examiner* — Jared Fureman
*Assistant Examiner* — Aqeel Bukhari
(74) *Attorney, Agent, or Firm* — ScienBiziP, P.C.

(57) ABSTRACT

A sensing device includes a main body, a first battery, a second battery, and a battery switching unit. The first battery includes a power terminal and an ID terminal having a length less than a length of the power terminal. When the battery switching unit detects that the power terminal and the ID terminal are both electrically connected to a connector positioned in the main body, the battery switching unit switches to the first battery and the sensing device is powered by the first battery; when the battery switching unit detects that the ID terminal is just disconnected with the connector, the first battery keeps providing power to the sensing device through the power terminal and the battery switching unit switches to the second battery so that the sensing device is powered by the second battery before the power terminal being disconnected with the connector.

18 Claims, 3 Drawing Sheets

(56) References Cited

U.S. PATENT DOCUMENTS

2015/0340898 A1* 11/2015 Schwartz ............... G06F 1/266
   320/103
2016/0150824 A1* 6/2016 Memari ................. A24F 15/12
   131/329

* cited by examiner

SENSING DEVICE AND WEARABLE DEVICE WITH SAME

CROSS-REFERENCE TO RELATED APPLICATIONS

This application claims priority to Chinese Patent Application No. 201510708296.7 filed on Oct. 28, 2015, the contents of which are incorporated by reference herein.

FIELD

The subject matter herein generally relates to a sensing device and a wearable device with same.

BACKGROUND

Electronic devices, for example, wearable devices are generally limited by small volume. Therefore, a capacity of a battery positioned at an interior of the electronic device is small and the electronic device cannot be used for a long time. Once the power of the battery is exhausted, the electronic device can only be normally operated after the battery is fully recharged.

BRIEF DESCRIPTION OF THE DRAWINGS

Implementations of the present technology will now be described, by way of example only, with reference to the attached figures.

DETAILED DESCRIPTION

Figure 1:
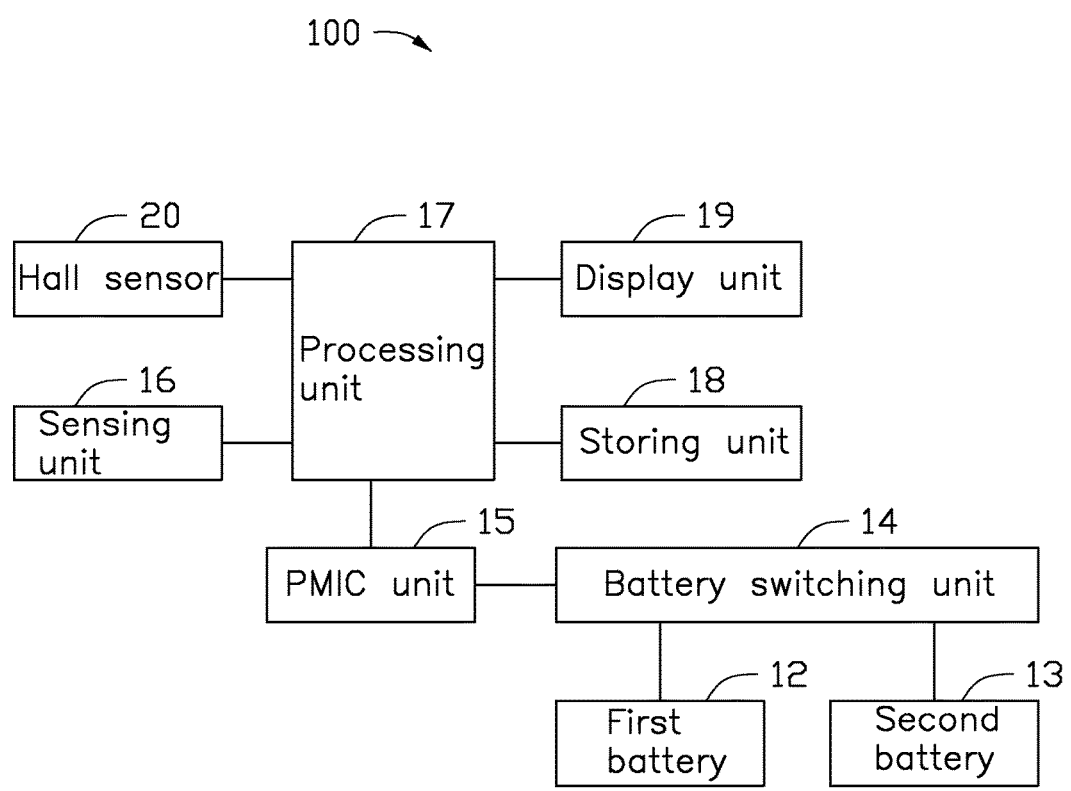
FIG. 1 is a block diagram of an embodiment of a sensing device applying to a wearable device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to an antenna module and a wireless communication device using same.

FIG. 1 illustrates an embodiment of a sensing device 100. The sensing device 100 includes a main body 11 (shown in FIG. 2), a first battery 12, a second battery 13, a battery switching unit 14, a power management integrate circuit (PMIC) unit 15, a sensing unit 16, a processing unit 17, and a storing unit 18.

Figure 2:
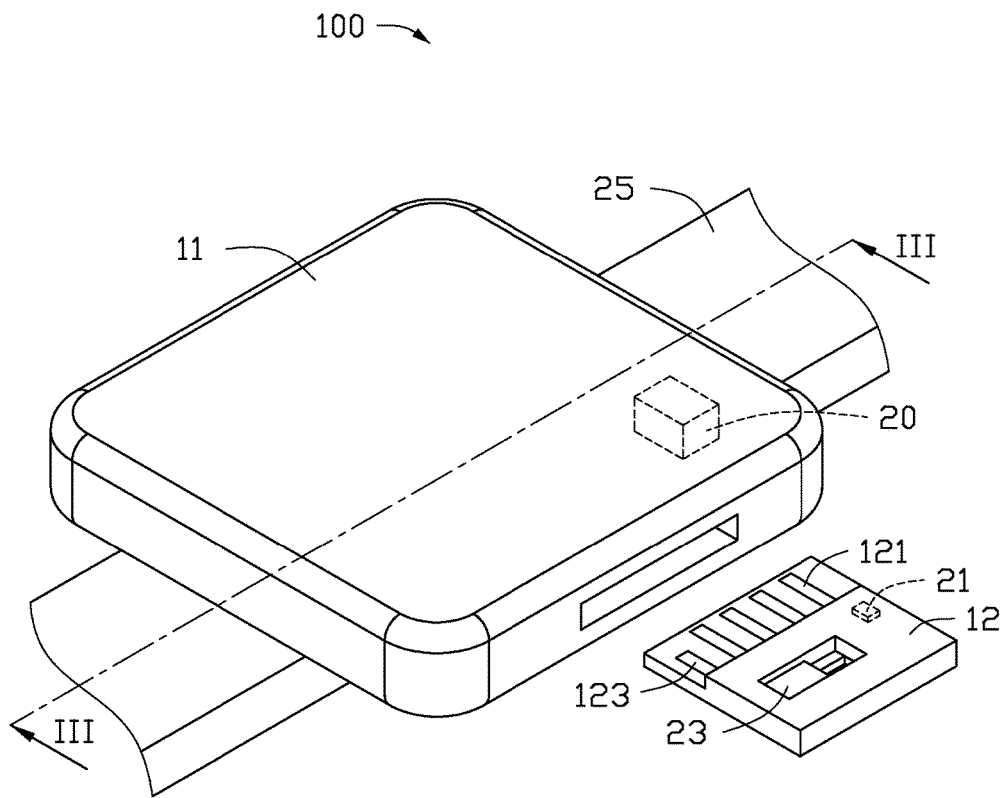
FIG. 2 is an isometric view of the wearable device of FIG. 1.

As illustrated in FIG. 2, the main body 11 can be circular, rectangular, or other shapes. The first battery 12 is positioned at an exterior of the main body 11 and can be plugged in the main body 11. The first battery 12 is further electrically connected to the PMIC unit 15 through the battery switching unit 14 for providing power to the PMIC unit 15.

The first battery 12 includes at least a power terminal 121 and an ID terminal 123. In one embodiment, the power terminal 121 and the ID terminal 123 are both metallic terminals. A length of the ID terminal 123 is less than a length of the power terminal 121. Then when the first battery 12 is inserted in the main body 11, the power terminal 121 and the ID terminal 123 are both electrically connected to a connector (not shown) positioned at an interior of the main body 11. Then the first battery 12 is electrically connected to the PMIC unit 15 for providing power to the PMIC unit 15. When the first battery 12 is removed from the main body 11, due to the length of the ID terminal 123 being less than that of the power terminal 121, the ID terminal 123 is firstly disconnected with the connector of the main body 11 and the power terminal 121 still keeps in connection with the connector. Then the first battery 12 temporarily provides power to the PMIC unit 15 through the power terminal 121 until the first battery 12 is fully removed from the main body 11. The full removal means that the power terminal 121 and the ID terminal 123 are both disconnected with the connector.

In one embodiment, a capacity of the second battery 13 is less than that of the first battery 12. The second battery 13 is positioned at an interior of the main body 11 and is electrically connected to the PMIC unit 15 through the battery switching unit 14. The second battery 13 is configured to provide power to the PMIC unit 15 when the ID terminal 123 of the first battery 12 is disconnected with the connector.

The battery switching unit 14 is electrically connected to the first battery 12 and the second battery 13. The battery switching unit 14 is configured to detect if the first battery 12 is inserted to the main body 11 or is removed from the main body 11. In one embodiment, the battery switching unit 14 can determine if the first battery 12 is inserted to the main body 11 or is removed from the main body 11 through detecting if the ID terminal 123 is electrically connected to the connector positioned in the main body 11. When the battery switching unit 14 detects that the power terminal 121 and the ID terminal 123 are both electrically connected to the connector in the main body 11, the battery switching unit 14 determines that the first battery 11 is plugged to the main body 11 and switches the PMIC unit 15 to the first battery 12, thereby the sensing device 100 is powered by the first battery 12. When the battery switching unit 14 detects that the ID terminal 123 is disconnected with the connector in the main body 11, the battery switching unit 14 determines that the first battery 12 is removed from the main body 11 and switches the PMIC unit 15 to the second battery 13, thereby the sensing device 100 is powered by the second battery 13.

When the first battery 12 is removed from the main body 11 and the ID terminal 123 is just disconnected with the connector in the main body 11, due to the power terminal 121 still electrically connected to the connector, the first battery 12 still provides power to the sensing device 100. Then the battery switching unit 14 can switch the PMIC unit 15 from the first battery 12 to the second battery 13 during the time lag between the disconnection of the ID terminal 123 and the disconnection of the power terminal 121, thereby ensuring that the sensing device 100 can be continually powered when the first battery 12 is removed from the main body 11.

The PMIC unit 15 is configured to provide power to the sensing device 100, that is, the PMIC unit 15 converts the power input to the PMIC unit 15 (for example, the first battery 12 and the second battery 13) to a plurality of power supplies with different voltages and/or currents that each module in the sensing device 100 needed, thereby providing power to each module of the sensing device 100.

The sensing unit 16 includes at least one sensor, for example, a healthy detecting sensor and/or an environment sensor. The healthy detecting sensor can at least include a pulse sensor for detecting a human's pulse and a temperature sensor for detecting a human's temperature. The environment sensor can at least include a temperature sensor for detecting an environment temperature, a humidity sensor for detecting environment humidity, and a pressure sensor for detecting an air pressure. The sensing unit 16 is positioned in the main body 11 and is configured to detect and provide sensing information, for example, health information and/or environment information.

The processing unit 17 can be a central processing unit (CPU) and is electrically connected to the sensing unit 16 and the storing unit 18. The processing unit 17 is configured to receive and process sensing information from the sensing unit 16, for example, health information and/or environment information, and selectable store the processed health information and/or environment information to the storing unit 18.

As illustrated in FIG. 1, the sensing device 100 can further include a display unit 19. The display unit 19 can be a liquid crystal module (LCM) and is positioned on the main body 11. The display unit 19 is electrically connected to the processing unit 17 and is configured to display time and/or the sensed information, for example, health information and/or environment information.

FIG. 2 illustrates that the sensing device 100 further includes a hall sensor 20, a magnetic unit 21, and an operating unit 23. The hall sensor 20 is positioned on the main body 11. The magnetic unit 21 can be a magnet and is positioned on the first battery 12. The magnetic unit 21 is connected to the operating unit 23. The operating unit 23 can be operated to switch the sensing device 100 to a normal mode or a sleep mode. For example, when the first battery 12 needs to be recharged or be replaced by another first battery 12, the operating unit 23 can be operated to switch the sensing device 100 to the sleep mode. When the first battery 12 is fully recharged or is replaced by a new first battery 12, the operating unit 23 can be operated again, thereby switching the sensing device 100 to the normal mode.

When the operating unit 23 is operated, the magnetic unit 21 moves closer to or away from the hall sensor 20. The hall sensor 20 is configured to sense the magnetic unit 21 and sends the sensing result to the processing unit 17. The processing unit 17 switches the sensing device 100 to the normal mode or the sleep mode according the sensed result from the hall sensor 20. For example, when the operating unit 23 is operated to make the magnetic unit 21 to move away from the hall sensor 20, the hall sensor 20 cannot sense the magnetic unit 21 or senses that the magnetic unit 21 is away from the hall sensor 20, whereby the processing unit 17 switches the sensing device 100 to the sleep mode for saving power of the sensing device 100 and makes the second battery 13 with a low capacity to provide power to the sensing device 100. When the operating unit 23 is operated to make the magnetic unit 21 to move closer to the hall sensor 20, the hall sensor 20 senses the magnetic unit 21 or senses that the magnetic unit 21 is moved closer to the hall sensor 20, the processing unit 17 switches the sensing device 100 to the normal mode.

In other embodiments, when the magnetic unit 21 moves away from the hall sensor 20, the sensing device 100 is switched to the normal mode. When the magnetic unit 21 moves closer to the hall sensor 20, the sensing device 100 is switched to the sleep mode.

In other embodiments, when the sensing device 100 is switched to the sleep mode, due to the sensing device 100 is continually powered by the first battery 12 or the second battery 13, the sensing unit 16 can work normally and the processing unit 17 can collect the sensing information continually. In other words, even if the sensing device 100 is in the sleep mode and the sensing device 100 is powered by the second battery 13 with a low capacity, the processing unit 17 can still and continually collect the sensing information from the sensing unit 16.

Figure 3:
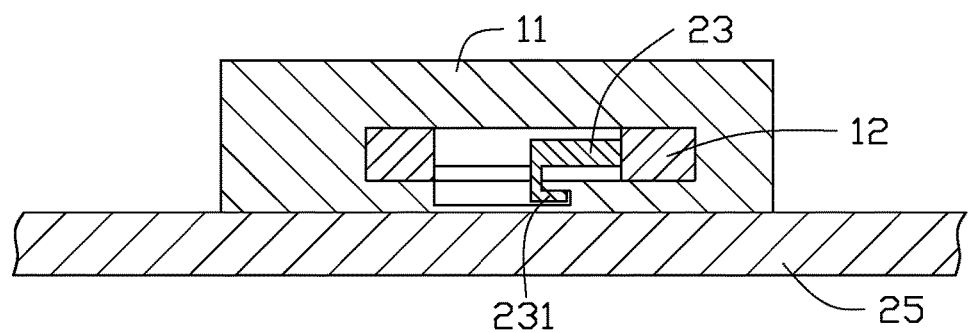
FIG. 3 is a cross-sectional view taken along line III-III of FIG. 2.

As illustrated in FIG. 3, in at least one embodiment, the operating unit 23 is located on the first battery 12. A bottom surface of the operating unit 23 has a latching structure 231, such as a hook or the like. The latching structure 231 is configured to attach the first battery 12 to the main body 11 when the sensing device 100 is in the normal mode and detach the first battery 12 from the main body 11 when the sensing device 100 is in the sleep mode. For example, when the operating unit 23 is operated to make the magnetic unit 21 to move closer to the hall sensor 20, the processing unit 17 switches the sensing unit 21 to the normal mode, then the latching structure 231 attaches the first battery 12 to the main body 11, thereby the first battery 12 can be stably latched in the main body 11. When the operating unit 23 is operated to make the magnetic unit 21 to move away from the hall sensor 20, the processing unit 17 switches the sensing unit 21 to the sleep mode. Then the latching structure 231 detaches the first battery 12 from the main body 11 and thus the first battery 12 can be easily removed from the main body 11.

In other embodiments, when the operating unit 23 is operated to make the magnetic unit 21 to move away from the hall sensor 20, the processing unit 17 switches the sensing unit 21 to the normal mode, then the latching structure attaches the first battery 12 to the main body 11, thereby the first battery 12 can be stably latched in the main body 11. When the operating unit 23 is operated to make the magnetic unit 21 to move closer to the hall sensor 20, the processing unit 17 switches the sensing unit 21 to the sleep mode. Then the latching structure detaches the first battery 12 from the main body 11 and thus the first battery 12 can be easily removed from the main body 11.

In other embodiments, a capacity of the first battery 12 can less than or equal to a capacity of the second battery 13. Then, when the sensing device 100 is switched to the second battery 13 from the first battery 12, the sensing device 100 does not need to enter the sleep mode, that is, the hall sensor 20, the magnetic unit 21, and the operating unit 23 can all be omitted.

It can be understood that in other embodiments, the sensing device 100 can further include a wearable portion 25. The wearable portion 25 can be attached at one end or two ends of the main body 11. Thereby the sensing device 100 and the wearable portion 25 can cooperatively form a wearable device (not labeled), for example, a wearable watch.

The embodiments shown and described above are only examples. Many details are often found in the art such as the other features of the antenna module and the wireless communication device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A sensing device comprising:
a main body having an exterior;
a first battery positioned at the exterior of the main body and configured to be plugged in the main body, the first battery comprising a power terminal and an ID terminal having a length less than a length of the power terminal;
a second battery positioned in the main body;
a hall sensor;
a magnetic unit;
a processing unit electrically connected to the hall sensor; and
a battery switching unit electrically connected to the first battery and the second battery;
wherein when the battery switching unit detects that the power terminal and the ID terminal are both electrically connected to a connector positioned in the main body, the battery switching unit switches to the first battery and the sensing device is powered by the first battery; when the battery switching unit detects that the ID terminal is just disconnected with the connector, the first battery keeps providing power to the sensing device through the power terminal and the battery switching unit switches to the second battery so that the sensing device is powered by the second battery before the power terminal is disconnected with the connector; and
wherein the magnetic unit is configured to move closer to or away from the hall sensor, the hall sensor is configured to sense a movement of the magnetic unit and send a sensing result to the processing unit; the processing unit is configured to switch the sensing device to one of a normal mode and a sleep mode according to the sensed result.

2. The sensing device of claim 1, wherein a capacity of the first battery is not greater than a capacity of the second battery.

3. The sensing device of claim 1, wherein a capacity of the first battery is greater than a capacity of the second battery.

4. The sensing device of claim 3, further comprising an operating unit, wherein the magnetic unit is connected to the operating unit, the magnetic unit moves closer to or away from the hall sensor when the operating unit is operated.

5. The sensing device of claim 1, wherein when the magnetic unit moves away from the hall sensor, the processing unit switches the sensing device to one of the normal mode and the sleep mode; when the magnetic unit moves closer to the hall sensor, the processing unit switches the sensing device to the other one of the normal mode and the sleep mode.

6. The sensing device of claim 1, wherein the operating unit further comprising a latching structure, the latching structure is configured to attach the first battery to the main body when the sensing device is in the normal mode and detach the first battery from the main body when the sensing device is in the sleep mode.

7. The sensing device of claim 1, further comprising a sensing unit configured to provide sensing information, wherein the sensing unit is electrically connected to the processing unit, when the sensing device is in the sleep mode, the processing unit continually collect the sensing information from the sensing unit.

8. The sensing device of claim 7, wherein the sensing unit comprises at least one of a healthy detecting sensor and an environment sensor.

9. The sensing device of claim 1, wherein the magnetic unit is a magnet, the magnetic unit and the operating unit are both positioned on the first battery.

10. A wearable device comprising:
a wearable portion; and
a sensing device comprising:
a main body attached to the wearable portion and having an exterior;
a first battery positioned at the exterior of the main body and configured to be plugged in the main body, the first battery comprising a power terminal and an ID terminal having a length less than a length of the power terminal;
a second battery positioned in the main body;
a hall sensor;
a magnetic unit;
a processing unit electrically connected to the hall sensor; and
a battery switching unit electrically connected to the first battery and the second battery;
wherein when the battery switching unit detects that the power terminal and the ID terminal are both electrically connected to a connector positioned in the main body, the battery switching unit switches to the first battery and the sensing device is powered by the first battery; when the battery switching unit detects that the ID terminal is just disconnected with the connector, the first battery keeps providing power to the sensing device through the power terminal and the battery switching unit switches to the second battery so that the sensing device is powered by the second battery before the power terminal being disconnected with the connector; and
wherein the magnetic unit is configured to move closer to or away from the hall sensor, the hall sensor is configured to sense a movement of the magnetic unit and send a sensing result to the processing unit the processing unit is configured to switch the sensing device to one of a normal mode and a sleep mode according to the sensed result.

11. The wearable device of claim 10, wherein a capacity of the first battery is not greater than a capacity of the second battery.

12. The wearable device of claim 10, wherein a capacity of the first battery is greater than a capacity of the second battery.

13. The wearable device of claim 12, further comprising an operating unit, wherein the magnetic unit is connected to the operating unit, the magnetic unit moves closer to or away from the hall sensor when the operating unit is operated.

14. The wearable device of claim 10, wherein when the magnetic unit moves away from the hall sensor, the processing unit switches the sensing device to one of the normal mode and the sleep mode; when the magnetic unit moves closer to the hall sensor, the processing unit switches the sensing device to the other one of the normal mode and the sleep mode.

15. The wearable device of claim 10, wherein the operating unit further comprising a latching structure, the latching structure is configured to attach the first battery to the main body when the sensing device is in the normal mode and detach the first battery from the main body when the sensing device is in the sleep mode.

16. The wearable device of claim 10, further comprising a sensing unit configured to provide sensing information, wherein the sensing unit is electrically connected to the processing unit, when the sensing device is in the sleep mode, the processing unit continually collects the sensing information from the sensing unit.

17. The wearable device of claim 16, wherein the sensing unit comprises at least one of a healthy detecting sensor and an environment sensor.

18. The wearable device of claim 10, wherein the magnetic unit is a magnet, the magnetic unit and the operating unit are both positioned on the first battery.

* * * * *